(12) United States Patent
Nakai

(10) Patent No.: US 8,222,124 B2
(45) Date of Patent: Jul. 17, 2012

(54) METHOD FOR MANUFACTURING SIMOX WAFER AND SIMOX WAFER

(75) Inventor: Tetsuya Nakai, Tokyo (JP)

(73) Assignee: Sumco Corporation, Tokyo (JP)

( * ) Notice: Subject to any disclaimer, the term of this patent is extended or adjusted under 35 U.S.C. 154(b) by 90 days.

(21) Appl. No.: 12/822,323

(22) Filed: Jun. 24, 2010

(65) Prior Publication Data

US 2010/0327397 A1    Dec. 30, 2010

(30) Foreign Application Priority Data

Jun. 25, 2009  (JP) ............................. P2009-150966
Jun. 23, 2010  (JP) ............................. P2010-142214

(51) Int. Cl.
*H01L 21/266* (2006.01)
*H01L 21/426* (2006.01)

(52) U.S. Cl. ........ 438/480; 438/526; 438/530; 438/798; 257/E21.563

(58) Field of Classification Search .................. 438/455, 438/458, 471, 473–476, 480, 514, 515, 522, 438/526–528, 530, 558, 795, 799, 974; 257/E21.561, E21.567, E21.568, E21.57, 257/E21.563

See application file for complete search history.

(56) References Cited

U.S. PATENT DOCUMENTS

| | | | | |
|---|---|---|---|---|
| 5,780,311 A * | 7/1998 | Beasom et al. | .............. | 438/406 |
| 6,191,007 B1 * | 2/2001 | Matsui et al. | .................. | 438/459 |
| 6,486,037 B2 * | 11/2002 | Norcott et al. | ................ | 438/406 |
| 6,756,257 B2 * | 6/2004 | Davari et al. | .................. | 438/151 |
| 7,115,463 B2 * | 10/2006 | Sadana et al. | ................. | 438/218 |
| 7,294,562 B2 * | 11/2007 | Nagano et al. | ................ | 438/481 |
| 7,537,989 B2 * | 5/2009 | Nakai et al. | ..................... | 438/218 |
| 7,718,231 B2 * | 5/2010 | Choe et al. | ..................... | 427/526 |
| 7,727,867 B2 | 6/2010 | Aoki et al. | | |
| 7,811,878 B2 * | 10/2010 | Nakai et al. | ..................... | 438/218 |
| 7,816,664 B2 * | 10/2010 | Bedell et al. | .................... | 257/19 |
| 8,053,837 B2 * | 11/2011 | Yamazaki | ..................... | 257/347 |
| 2001/0002329 A1 * | 5/2001 | Ling | ............................. | 438/459 |
| 2004/0023473 A1 * | 2/2004 | Divakaruni et al. | ........... | 438/551 |
| 2004/0082132 A1 * | 4/2004 | Comard | ........................ | 438/296 |
| 2005/0003626 A1 * | 1/2005 | Fox et al. | ...................... | 438/404 |
| 2005/0032327 A1 * | 2/2005 | Ohnishi et al. | ................ | 438/424 |
| 2005/0045984 A1 * | 3/2005 | Lin | ................................. | 257/510 |
| 2005/0181612 A1 * | 8/2005 | Brask et al. | .................... | 438/689 |
| 2005/0205930 A1 * | 9/2005 | Williams, Jr. | ................. | 257/347 |

(Continued)

FOREIGN PATENT DOCUMENTS

JP    2004-193185    7/2004

(Continued)

*Primary Examiner* — Matthew Landau
*Assistant Examiner* — Maliheh Malek
(74) *Attorney, Agent, or Firm* — Greenblum & Bernstein, P.L.C.

(57) ABSTRACT

This method for manufacturing a SIMOX wafer includes: forming a mask layer on one surface side of a silicon single crystal wafer, which has an opening on a region where a BOX layer is to be formed; implanting oxygen ions through the opening of the mask layer into the silicon single crystal wafer to a predetermined depth, and locally forming an oxygen implantation region; annealing the silicon single crystal wafer with the mask layer, and oxidizing the oxygen implantation region so as to form the BOX layer; and removing a coated oxide film that covers the whole silicon single crystal wafer which is formed in the annealing of the silicon single crystal wafer, wherein the mask layer has a lamination comprising an oxide film and either one or both of a polysilicon film and an amorphous silicon film.

6 Claims, 8 Drawing Sheets

U.S. PATENT DOCUMENTS

| | | | |
|---|---|---|---|
| 2006/0040476 A1* | 2/2006 | Sadana et al. | 438/479 |
| 2006/0084249 A1* | 4/2006 | Yamada | 438/526 |
| 2006/0141398 A1* | 6/2006 | Shimoji et al. | 430/314 |
| 2006/0276040 A1* | 12/2006 | Abraham | 438/689 |
| 2006/0281233 A1* | 12/2006 | Aoki et al. | 438/149 |
| 2007/0077718 A1* | 4/2007 | Nakai | 438/311 |
| 2007/0111465 A1* | 5/2007 | Yoshizawa et al. | 438/406 |
| 2007/0117361 A1* | 5/2007 | Nakai | 438/514 |
| 2007/0178680 A1* | 8/2007 | Aoki et al. | 438/526 |
| 2007/0238269 A1 | 10/2007 | Aoki et al. | |
| 2008/0050891 A1* | 2/2008 | Hsu et al. | 438/481 |
| 2008/0135949 A1* | 6/2008 | Lo et al. | 257/401 |
| 2008/0242048 A1* | 10/2008 | Nakai et al. | 438/440 |
| 2008/0254603 A1* | 10/2008 | Fujikawa et al. | 438/522 |
| 2009/0057811 A1* | 3/2009 | Murakami et al. | 257/506 |
| 2009/0130816 A1 | 5/2009 | Takahashi et al. | |
| 2009/0197392 A1* | 8/2009 | Isaka et al. | 438/458 |
| 2009/0203187 A1* | 8/2009 | Nakai et al. | 438/423 |
| 2010/0090303 A1* | 4/2010 | Takizawa | 257/432 |
| 2010/0197047 A1 | 8/2010 | Ko | |
| 2010/0291755 A1* | 11/2010 | Isaka et al. | 438/458 |
| 2011/0012090 A1* | 1/2011 | Singh et al. | 257/24 |
| 2011/0180912 A1* | 7/2011 | Kononchuk | 257/647 |

FOREIGN PATENT DOCUMENTS

| | | |
|---|---|---|
| JP | 2005-268511 | 9/2005 |
| JP | 2007-142134 | 6/2007 |
| JP | 2007-142135 | 6/2007 |

* cited by examiner

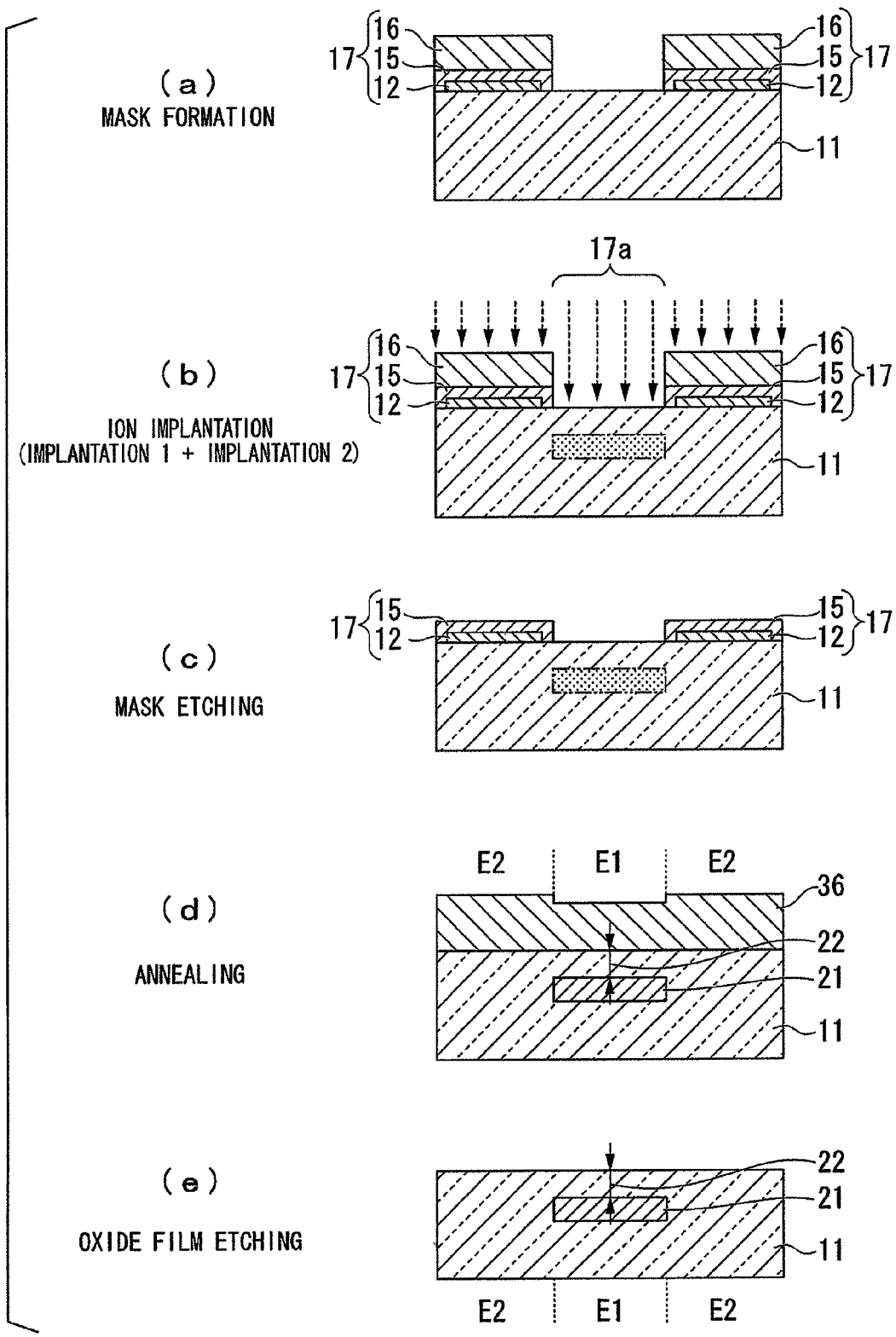

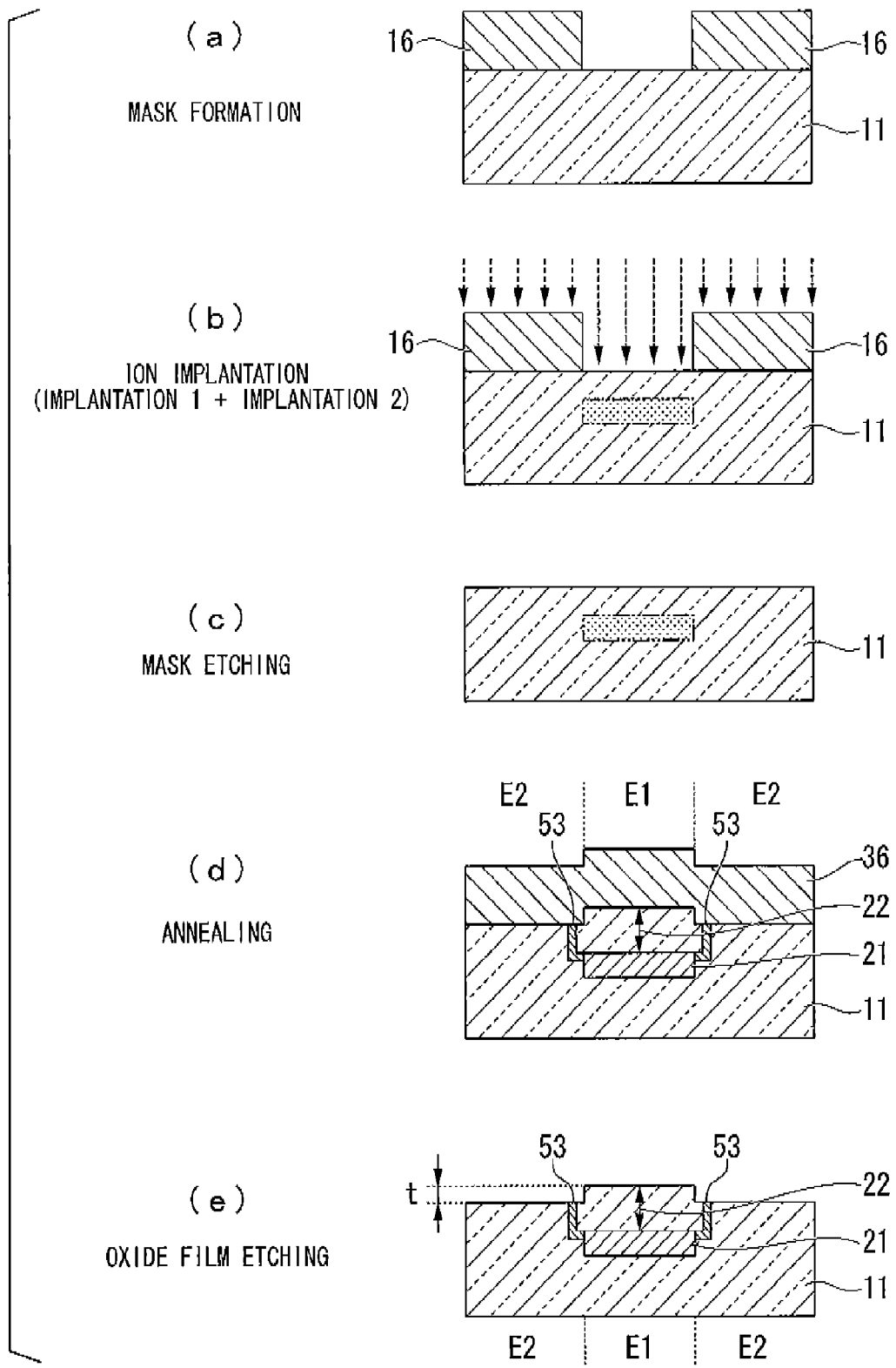

METHOD FOR MANUFACTURING SIMOX WAFER AND SIMOX WAFER

BACKGROUND OF THE INVENTION

1. Field of the Invention

The present invention relates to a method for manufacturing a SIMOX wafer, and a SIMOX wafer manufactured thereby, and in particular, the present invention relates to a technique for satisfactorily maintaining surface flatness of the SIMOX wafer in which a BOX (buried oxide) layer is locally formed.

This application claims priority from Japanese Patent Application No. 2009-150966, filed on Jun. 25, 2009 and Japanese Patent Application No. 2010-142214, filed on Jun. 23, 2010, the contents of which are incorporated herein by reference.

2. Background Art

In an SOI (Silicon On Insulator) wafer, a silicon oxide film (referred to as "BOX layer") is buried in a silicon single crystal wafer, and an upper layer of this BOX layer is covered by a silicon single crystal thin film (referred to as "SOI layer"). In the SOI wafer, a substrate portion and the SOI layer which is a device manufacturing layer can be electrically separate from each other. For this reason, satisfactory properties are attained in breakdown voltage, parasitic capacity, and radiation resistance capability without occurring the substrate bias effect. As a result, effects such as high speed, low power consumption, and soft error free are expected, and a variety of research and development is performed on the SOI wafer to realize a substrate for next-generation devices.

Examples of the method for manufacturing the SOI wafers typically include a so-called wafer bonding technique and a SIMOX (Separation by Implanted Oxygen) technique. In the wafer bonding technique, oxide films are formed in either one or both of two wafers, and then the two wafers are bonded with the oxide film disposed therebetween so as to manufacture the SOI wafer.

On the other hand, in the SIMOX technique, oxygen ions are implanted into a silicon single crystal wafer, and then the silicon single crystal wafer is subjected to an annealing treatment in an atmosphere of argon or oxygen gas; and thereby, in an oxygen implanted region where supersaturated amount of oxygen is included, silicon atoms are oxidized and the oxygen implanted region is converted into the BOX layer. As a result, it is possible to obtain a SIMOX wafer having a structure where the surface is covered by the SOI layer, and the BOX layer is buried in the inside of the silicon single crystal wafer. Such a SIMOX technique does not need grinding and polishing processes which are needed in the wafer bonding technique; and therefore, the SIMOX technique has the advantage of being able to manufacture the SIMOX wafer through relatively simple processes.

In the case where such a SIMOX wafer is used for manufacturing a system LSI including a logic section, a memory section and the like, the SIMOX wafer is used in which the BOX layer is partially formed such that the BOX layer is formed only in a portion where the logic section is to be formed, and the BOX layer is not formed in a portion where the memory section is to be formed (referred to as "bulk portion"). By using such a SIMOX wafer, it is possible to simplify the LSI manufacturing process which is a post-process.

As the method for manufacturing the SIMOX wafer in which the BOX layer is partially provided as described above, a method has been known which includes forming a mask layer on one surface side of the silicon single crystal wafer such that the mask layer covers the bulk portion and an opening section is provided in a region where the BOX layer is to be formed. In accordance with this method, in the process of implanting oxygen ions, an oxygen implantation region is formed only in a region corresponding to the opening section of the mask layer, and the oxygen implantation is prohibited in the bulk portion due to the barrier effect of the mask layer. Thereafter, only the oxygen implantation region corresponding to the opening section of the mask layer is converted into the BOX layer by the annealing treatment, and thereby, the SIMOX wafer can be obtained in which the BOX layer is partially formed in a predetermined pattern.

In a SIMOX wafer in which the BOX layer is partially formed, there is a problem that the surface flatness is poor. In the oxygen implantation region into which oxygen ions are implanted, the volume increases at the time the silicon is oxidized by the annealing treatment to form the BOX layer. For example, the volume increases by approximately 2.2 times in accordance with an oxidation reaction of $Si+O_2=SiO_2$. Thereby, a step difference occurs in the surface of the wafer between the bulk portion and the portion in which the BOX layer is formed. By a simple calculation, with regard to the surface of the portion in which the BOX layer is formed, the surface height after oxidation becomes higher than that before oxidation, and the height difference (step difference) equals to the height of about 55% of the film thickness of the BOX layer. Such a step difference causes overlay issues when a circuit is formed by photolithography in a post-process.

As a method for reducing surface bumps between the BOX layer forming portion and the bulk portion of the SIMOX wafer, for example, Japanese Unexamined Patent Application Publication No. 2004-193185 discloses a method for manufacturing the SOI substrate includes a process of implanting oxygen ions into an inside of a silicon single crystal wafer, and a process of performing an annealing treatment so as to form a BOX layer, wherein the method further includes a process of thinning a first oxide film of a mask layer to a thickness equivalent to an increased amount of thickness to be increased by conversion into the BOX layer between the process of implanting oxygen ions and the process of forming the BOX layer.

In addition, for example, Japanese Unexamined Patent Application Publication No. 2007-142134 or Japanese Unexamined Patent Application Publication No. 2005-268511 discloses a method for manufacturing the SOI substrate which includes a process of etching a BOX layer forming portion (a portion where a BOX layer is to be formed) by dry etching so as to provide a step difference in advance between the BOX layer forming portion and a bulk portion, before implanting oxygen ions into the BOX layer forming portion, wherein the step difference (difference in height) is equivalent to an increased amount of thickness to be increased by conversion into the BOX layer.

Moreover, for example, Japanese Unexamined Patent Application Publication No. 2007-142135 discloses a method for manufacturing the SOI substrate which includes a process of forming a thermally-oxidized film by thermal oxidation and dry etching so as to provide a step difference in advance between a BOX layer forming portion and a bulk portion, before implanting oxygen ions into the BOX layer forming portion, wherein the step difference is equivalent to an increased amount of thickness to be increased by conversion into a BOX layer.

However, for example, in the manufacturing method disclosed in Japanese Unexamined Patent Application Publication No. 2004-193185, a silicon oxide film is used as the mask layer, and when the mask layer of the silicon oxide film (mask oxide film) is wet-etched to a predetermined thickness, it has been difficult to control the film thickness of the mask oxide film in good uniformity and reproducibility in a wafer and between the wafers. In addition, since the wet etching is an isotropic etching, there has occurred a phenomenon that the side along the thickness direction of the mask oxide film is also etched, and thereby, the width of the mask oxide film or the area of the mask oxide film becomes small when seen in a plan view. As a result, it is likely that the mask oxide film does not cover a desired region, and thus the BOX layer is exposed to the surface, and when the mask oxide film is removed, the exposed portion of the BOX layer is removed; and thereby, there is a fear of forming a cavity. Therefore, there has been a need as well to solve such a phenomenon.

In addition, for example, in the manufacturing methods disclosed in Japanese Unexamined Patent Application Publication Nos. 2007-142134 and 2005-268511, it is difficult to satisfactorily maintain the flatness of the whole surface of the wafer by the dry etching, and it is also difficult to control the film thickness in good reproducibility. In addition, by using the dry etching, physical damage remains in the surface of the wafer, and this also becomes the cause of deteriorating the characteristics of a device.

Moreover, for example, in the manufacturing method disclosed in Japanese Unexamined Patent Application Publication No. 2007-142135, there has been a problem that when the mask oxide film is formed, a region just below this mask oxide film is also oxidized; and thereby, the size cannot be constantly maintained.

The present invention is devised to solve the above-mentioned problems, and the present invention aims to provide a method for manufacturing a SIMOX substrate in which a BOX layer is partially formed, which is capable of satisfactorily maintaining the surface flatness through simple processes with good reproducibility. In addition, the present invention also aims to provide a SIMOX substrate in which the BOX layer is partially formed, which satisfactorily maintains the surface flatness, and has few surface defects.

SUMMARY OF THE INVENTION

In order to solve the above-mentioned problems, the present invention provides a method for manufacturing the following SIMOX substrate.

The method for manufacturing the SIMOX wafer according to the present invention is a method for manufacturing a SIMOX wafer where a BOX layer composed of silicon oxide is locally formed in an interior of a silicon single crystal wafer, and the method includes: forming a mask layer on one surface side of a silicon single crystal wafer, which has an opening on a region where a BOX layer is to be formed; implanting oxygen ions through the opening of the mask layer into the silicon single crystal wafer to a predetermined depth, and locally forming an oxygen implantation region; annealing the silicon single crystal wafer with the mask layer, and oxidizing the oxygen implantation region so as to form the BOX layer; and removing a coated oxide film that covers the whole silicon single crystal wafer which is formed in the annealing of the silicon single crystal wafer, wherein the mask layer has a lamination comprising an oxide film and either one or both of a polysilicon film and an amorphous silicon film.

In the method for manufacturing the SIMOX wafer according to the present invention, the oxide film of the mask layer may be composed of silicon oxide.

The mask layer may be composed of a first silicon oxide film, either one or both of the polysilicon film and the amorphous silicon film, and a second silicon oxide film, which are laminated in this order from the one surface side of the silicon single crystal wafer.

The method may further include removing the second silicon oxide film from the mask layer between the implanting of the oxygen ions and the annealing of the silicon single crystal wafer.

The removing of the second silicon oxide film may be conducted by a wet etching method.

End portions of either one or both of the polysilicon film and the amorphous silicon film may extend towards the silicon single crystal wafer so as to cover sides along a thickness direction of the oxide film positioned beneath either one or both of the polysilicon film and the amorphous silicon film.

A silicon wafer surface step difference between a region where the BOX layer is formed and a region where the mask layer is formed after the removing of the coated oxide film may be 10 nm or less.

In addition, the present invention provides the following SIMOX wafer. That is, the SIMOX substrate according to the present invention is manufactured by the method for manufacturing the SIMOX wafer according to the present invention as described above.

In accordance with the method for manufacturing the SIMOX wafer of the present invention, either one or both of the polysilicon film and the amorphous silicon film are included in a portion of the mask layer. Thereby, in the annealing process, it is possible to make the thickness of the silicon oxide film formed in a bulk region (region where a BOX layer is not formed) thinner than the thickness of the silicon oxide film formed in an SOI region. As a result, after the coated oxide film that covers the whole silicon single crystal wafer which is formed in the annealing process is removed by the wet etching method, it is possible to eliminate the silicon wafer surface step difference (step difference in the surface of silicon single crystal wafer) between the region where the BOX layer is formed and the region where the mask layer is formed; and thereby, the flatness can be maintained. At the same time, it is possible to reliably prevent the edge portion of the BOX layer from being exposed to the surface.

In accordance with the SIMOX wafer of the present invention, a flat surface is provided which has no step difference between a bulk region and an SOI region; and thereby, it is possible to prevent occurrence of troubles where the focus is deviated when a circuit is formed by photolithography in the post-process.

BRIEF DESCRIPTION OF THE DRAWINGS

FIG. 7 shows cross-sectional views illustrating, in a stepwise manner, manufacturing processes of examples of the present invention in EXAMPLES.

FIG. 8 shows cross-sectional views illustrating, in a stepwise manner, manufacturing processes of conventional examples in EXAMPLES.

Figure 1:
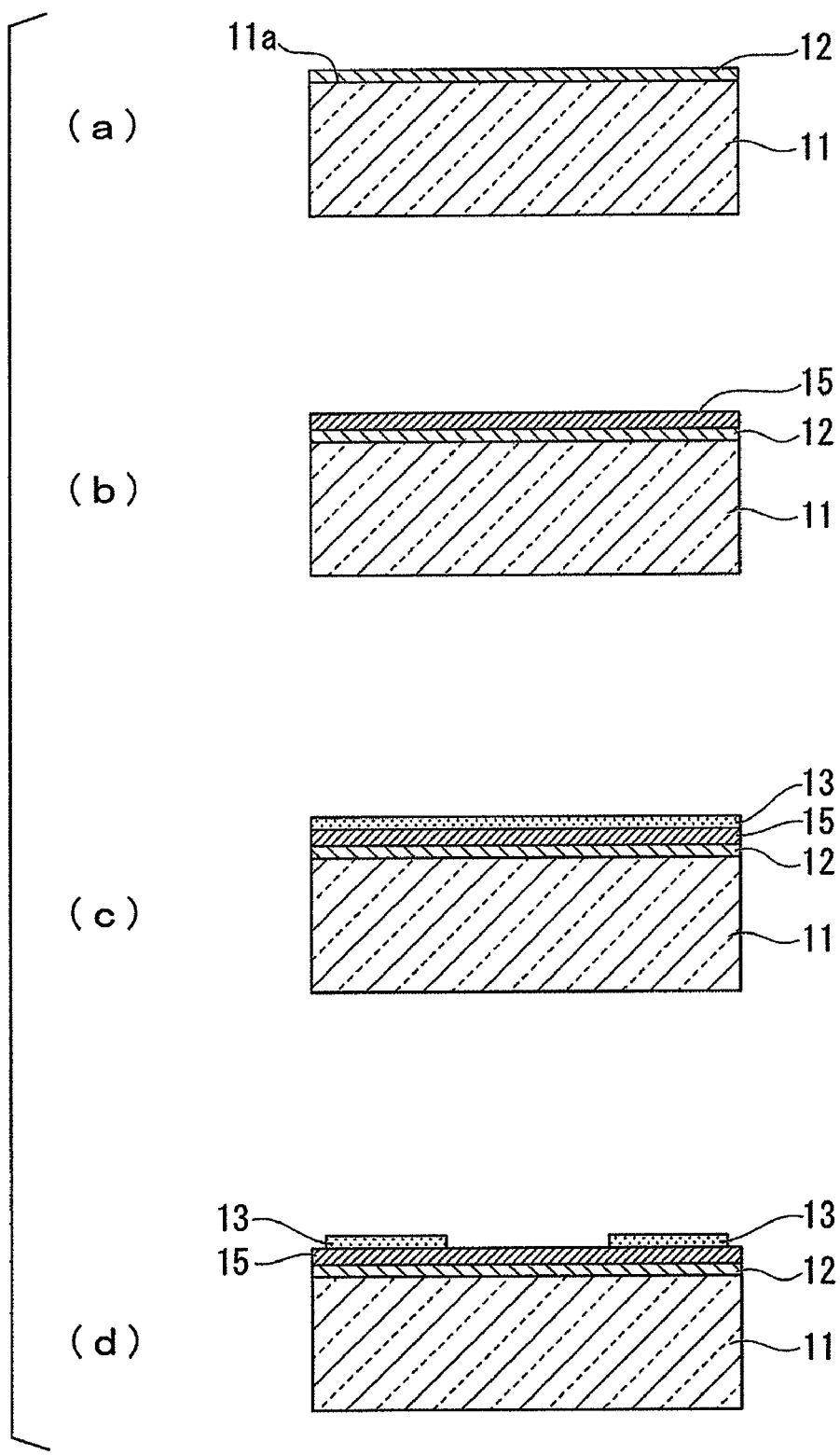
FIG. 1 shows cross-sectional views illustrating, in a step-wise manner, processes of an example of a method for manufacturing a SIMOX wafer according to the present invention.

DESCRIPTION OF THE REFERENCE NUMERALS 11 substrate (silicon single crystal wafer), 12 surface oxide film (first silicon oxide film), 15 silicon film (either one or both of polysilicon film and amorphous silicon film), 16 mask oxide layer (second silicon oxide layer), 17 mask layer, 19 oxygen high-concentration layer (oxygen implantation region), 21 BOX layer, and 40 SIMOX wafer.

PREFERRED EMBODIMENTS

Hereinafter, reference is made to the drawings to describe the best mode of the method for manufacturing the SIMOX wafer according to the present invention. Meanwhile, the embodiment is a specific example for the purpose of better comprehending the present invention, and the present invention is not limited thereto, except as otherwise noted.

Figure 2:
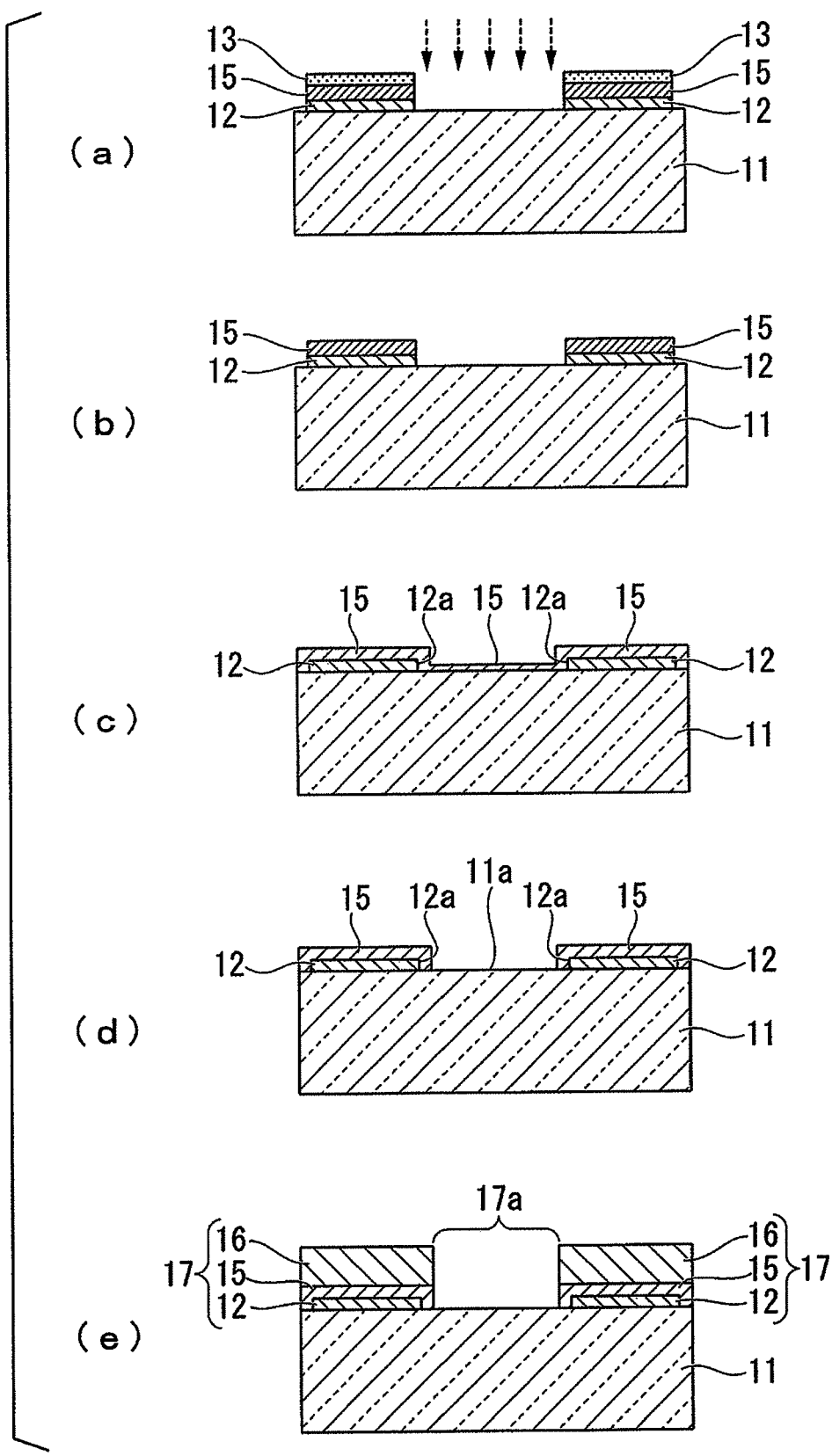
FIG. 2 shows cross-sectional views illustrating, in a step-wise manner, processes subsequent to the processes shown in FIG. 1 in the example of the method for manufacturing of the SIMOX wafer according to the present invention.
Figure 3:
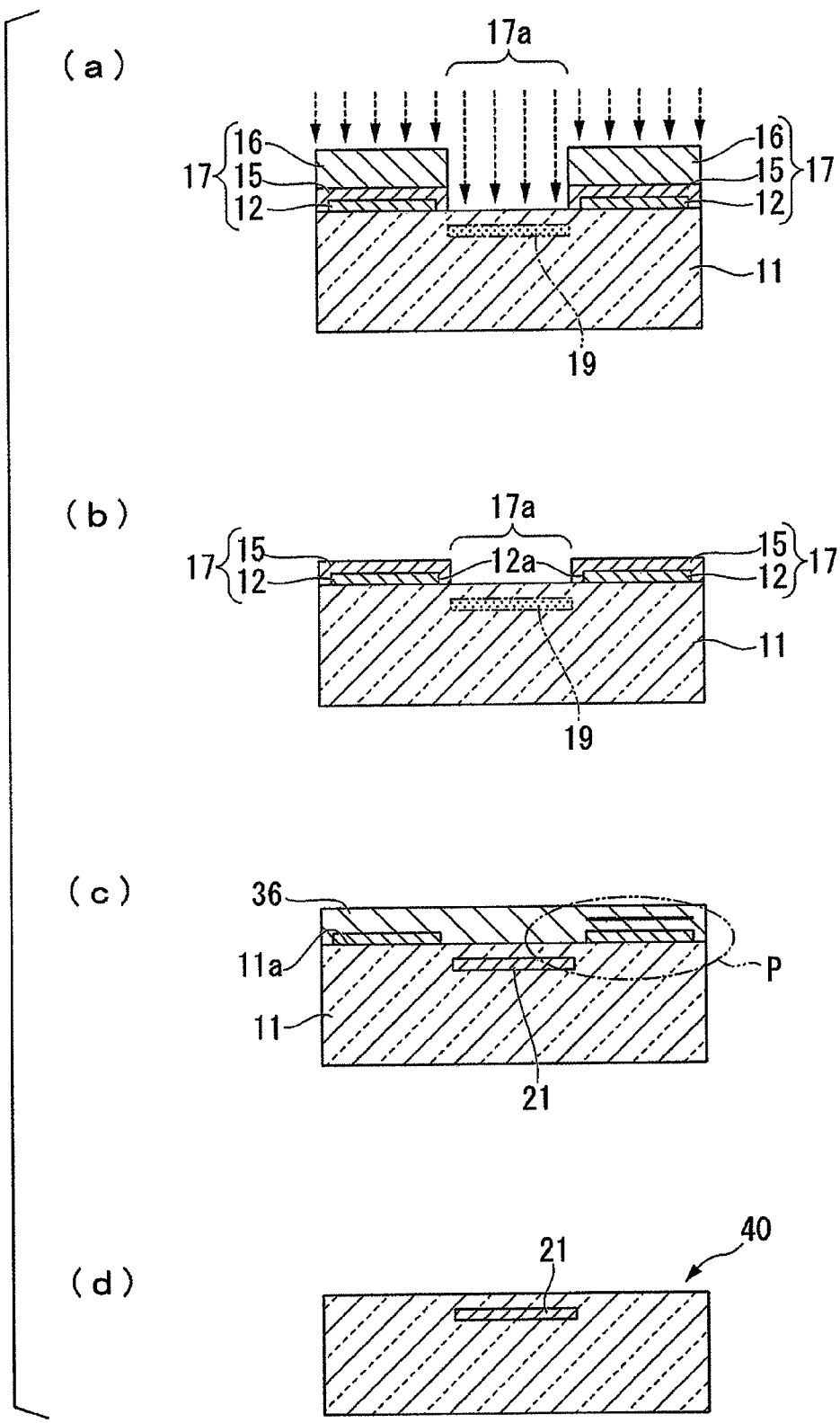
FIG. 3 shows cross-sectional views illustrating, in a step-wise manner, processes subsequent to the processes shown in FIG. 2 in the example of the method for manufacturing of the SIMOX wafer according to the present invention.

FIGS. 1 to 3 show explanatory diagrams illustrating, in a stepwise manner, processes of an example of the method for manufacturing the SIMOX wafer according to the present invention. As shown in FIG. 1(a), a substrate 11 may be a silicon single crystal wafer which is cut out from a silicon single crystal ingot grown by a Czochralski (CZ) method in a thin-plate shape. In addition to the silicon single crystal ingot formed by the CZ method, a silicon single crystal wafer may be used which is cut out from a silicon single crystal ingot grown by, for example, a floating zone (FZ) method. In addition, it is also preferable to use an epitaxial wafer which is obtained by epitaxially growing a silicon single crystal film on the surface thereof, or an Ar annealed wafer which is obtained by being subjected to an argon annealing process.

At first, a process of forming a mask layer on the substrate 11 (silicon single crystal wafer) will be described. Initially, a surface oxide film (first silicon oxide film) 12 is formed on one surface 11a of the substrate (silicon single crystal wafer) 11 (FIG. 1(a)). This surface oxide film 12 is a thin film composed of silicon oxide ($SiO_2$ film). The surface oxide film 12 can be formed by thermally oxidizing the substrate 11, or by a CVD method (chemical vapor deposition method).

Next, a silicon film (either one or both of a polysilicon film and an amorphous silicon film) 15 is formed on the surface of the surface oxide film 12 so as to overlap the surface oxide film 12 (FIG. 1(b)). Further, a resist layer 13 is formed (by applying a resist liquid) so as to overlap this silicon film 15 (FIG. 1(c)). And then, this resist layer 13 is formed in a predetermined shape (see FIG. 1(d)). The shape of the resist layer 13 may be formed in accordance with the formation pattern of a mask layer which is to be formed in, for example, a post-process. That is, it may be formed in a shape such that an opening is provided in a portion situated on a region of the substrate 11 where oxygen ions are to be implanted (region where a BOX layer is to be formed).

Next, by using this resist layer 13 as a mask, the surface oxide film 12 and the silicon film 15 are subjected to etching (FIG. 2(a)). At the time of etching, dry etching, for example, reactive ion etching may be performed. Thereafter, the resist layer 13 is removed (FIG. 2(b)). Next, another silicon film 15 having a thinner thickness is further formed; and thereby, the silicon film 15 is formed in a shape where lateral sides 12a of the surface oxide film 12 are also covered (FIG. 2(c)). In this process, the silicon film 15 is formed such that the thickness of sidewall portions covering the lateral sides 12a of the surface oxide film 12 is, for example, within a range of 10 to 200 nm, preferably within a range of 20 to 100 nm.

After that, anisotropic etching is performed in a vertical direction with respect to one surface 11a of the substrate 11, and only portions of the silicon film 15 covering one surface 11a of the substrate 11 and other than portions where a mask layer is to be formed are selectively removed (FIG. 2(d)). Examples of the anisotropic etching include, for example, a reactive ion etching. In the reactive ion etching, a substrate is placed at a lower electrode of two opposite electrodes which are installed in a reaction chamber. Next, plasma is induced by applying a high-frequency voltage between these electrodes; and thereby, radical ion nuclides having a high reactivity are formed from an etching gas. The radical ions having an energy of tens to hundreds of eV are irradiated on the substrate 11 due to self-bias potential difference generated between the plasma and the substrate 11. Only the portions of the silicon film 15 covering one surface 11a of the substrate 11 are selectively etched by both effects of the sputtering action due to the radical ions and the chemical reaction.

Then a mask oxide film (second silicon oxide film) 16 is formed so as to overlap the silicon film 15 (FIG. 2(e)). The mask oxide film 16 is formed by, for example, the following method. At first, the silicon oxide ($SiO_2$ film) is formed on one surface 11a side of the substrate 11 including the surface oxide film 12. After that, by the anisotropic etching or the like, the silicon oxide ($SiO_2$ film) is etched such that the mask oxide film 16 remains on only portions where the silicon film 15 is formed. Here, this mask oxide film (second silicon oxide film) 16 may not necessarily be formed.

As described above, through the processes of forming the mask layer shown in FIGS. 1(a) to 2(e), a mask layer 17 is formed on one surface 11a of the substrate 11, and in the mask layer 17, the surface oxide film (first silicon oxide film) 12, the silicon film (either one or both of the polysilicon film and the amorphous silicon film) 15, and the mask oxide film (second silicon oxide film) 16 are laminated in this order (see FIG. 2(e)).

Such a mask layer 17 is formed such that an opening 17a is provided in a portion corresponding to a region of the substrate 11 where oxygen ions are to be implanted (region where a BOX layer is to be formed) in the post-process. In addition, the thicknesses of the surface oxide film 12 and the silicon film 15 are formed at an optimal ratio such that the surface flatness of the substrate (silicon single crystal wafer) 11 is maintained after the final removal of the silicon oxide film, in response to a variation in the thickness of each portion caused by the annealing process which is a post-process. This will be described later in the description of the annealing process.

Next, as shown in FIG. 3(a), oxygen ions are implanted into a region of the substrate 11 which is exposed from the opening 17a of the mask layer 17 (oxygen implantation process). When the oxygen ions are irradiated towards the substrate 11 with a predetermined energy, oxygen ions are implanted from a portion exposed in the opening 17a into the substrate 11. Thereby, an oxygen high-concentration layer (oxygen implantation region) 19 is formed in a region which goes slightly into the inside from one surface 11a of the substrate 11. On the other hand, the implantation of oxygen ions is blocked in a portion (bulk portion) of the substrate 11 which is covered by the mask layer 17. As a result, it is possible to partially (locally) form the oxygen high-concentration layer (oxygen implantation region) 19 in accordance with the formation pattern of the mask layer 17.

In this oxygen implantation process, examples of the oxygen ion implantation conditions are exemplified as follows. The implantation amount (dose amount) is within a range of $1\times10^{17}/cm^2$ to $2\times10^{18}/cm^2$, and preferably within a range of $2\times10^{17}/cm^2$ to $5\times10^{17}/cm^2$. The implantation energy is within a range of 20 keV to 240 keV, preferably within a range of 60 keV to 220 keV. In addition, with regard to the operation of the oxygen ion implantation, the implantation may be conducted in two or more steps while the implantation energy and the implantation amount (dose amount) in each of step are adjusted to different values from those in other steps.

Subsequently, as shown in FIG. 3(b), the mask oxide film (second silicon oxide film) 16 in the mask layer 17 is removed (oxide film removal process). The removal of the mask oxide film 16 may be performed by, for example, wet etching which is specifically reactive to the silicon oxide. Thereby, the mask oxide film 16 composed of the silicon oxide film is removed.

Since the silicon film 15 composed of either one or both of a polysilicon film and an amorphous silicon film is formed on the surface oxide film 12, this silicon film 15 plays a role as an etching stopper at the time of removing the mask oxide film 16. For this reason, by setting the total film thickness of the surface oxide film 12 and the silicon film 15 to be the same as a set value of a film thickness of the mask layer 17 which is to be remained after the removal of the mask oxide film 16, the film thickness of the mask layer 17 in the post-process can be controlled easily and with a good reproducibility.

Conventionally, in the process of removing the mask oxide film in the mask layer, in the case where isotropic etching such as the wet etching is performed, the surface oxide film disposed as the lower layer of the mask oxide film is etched from the side thereof; and thereby, the width of the surface oxide film decreases. In the case where the width of the surface oxide film of the mask layer is reduced, in the annealing process which is a post-process, a phenomenon occurs where the BOX layer to be formed is grown toward a region which is not covered by the mask layer, and the end portion of the BOX layer is exposed to the surface of the substrate. In the case where the end portion of the BOX layer is exposed to the surface of the substrate, there has been a problem that in the process of etching the mask layer where the silicon oxide is specifically removed, the BOX layer composed of silicon oxide is also etched from the end portion exposed to the surface of the substrate, and thus fine holes are generated.

In contrast, in the present invention, the mask layer 17 includes the silicon film 15, and this silicon film 15 covers even the lateral sides 12a of the surface oxide film 12 along the thickness direction. Therefore, even when the isotropic etching such as the wet etching which is specifically reactive to the silicon oxide is performed, there is no case where the surface oxide film 12 is etched from the lateral sides 12a thereof. For this reason, since the width of the mask layer 17 is not reduced, it is possible to reliably prevent the generation of defects such as pits or the like in the surface of the substrate 11 after the removal of the mask layer 17. Here, in the case where the mask oxide film (second silicon oxide film) 16 is not particularly formed, such an oxide film removal process may not be necessary.

Subsequently, as shown in FIG. 3(c), after the mask oxide film 16 is removed, the substrate 11 where the mask layer 17 composed of the surface oxide film 12 and the silicon film 15 remains is annealed (annealing process). Examples of the annealing include a method which includes holding a temperature of the substrate 11 within a temperature range of 1,300 to 1,380° C. for 2 to 20 hours in an oxidizing atmosphere, and thereafter cooling slowly. Examples of the oxidizing atmosphere include a mixed gas atmosphere of inert gas and oxygen gas. A mixed gas atmosphere of argon and oxygen gas, and a mixed gas atmosphere of nitrogen and oxygen gas are exemplified. In the oxidizing atmosphere, the content of oxygen gas is preferably within a range of 0.5 to 90 wt %, and more preferably within a range of 40 to 70 wt %.

Oxidation of the oxygen high-concentration layer 19 (FIG. 3(b)) formed in the substrate 11 is accelerated by this annealing process. Thereby, a silicon single crystal thin film (referred to as an SOI layer) is disposed on the surface side, and the BOX layer (silicon oxide film) 21 which is buried in the inside of the substrate 11 is locally formed.

In such an annealing process, when the oxygen high-concentration layer 19 is thermally oxidized and is converted into the BOX layer, the volume of this BOX layer 21 expands to a volume of greater than the volume before the thermal oxidation. For example, when the oxygen high-concentration layer 19 is converted into the BOX layer 21, the thickness thereof increases by about 2.2 times. In addition, one surface 11a of the substrate 11 composed of silicon single crystal is also thermally oxidized, and the silicon oxide film is formed.

The mask layer 17 formed on the bulk region of the substrate 11 includes the silicon film 15 which is composed of either one or both of the polysilicon film and the amorphous silicon film in the surface. For this reason, after starting the thermal oxidation, oxygen is consumed in order to oxidize the silicon film 15 in the mask layer 17, and then the lower portion of the mask layer 17, that is, one surface 11a of the substrate 11 in the bulk region is oxidized. Therefore, the oxidized amount of the surface portion of the single crystal silicon wafer is suppressed in the bulk region. On the other hand, with regard to one surface 11a (SOI layer) of the substrate 11 in an upper portion on the BOX layer 21, that is, in a region (SOI region) where the mask layer 17 is not formed, oxidation begins just after starting the thermal oxidation, and the silicon oxide film is formed. For this reason, the oxidized amount of the surface portion of the single crystal silicon wafer is larger than that in the bulk region.

As a result, in the surface of the substrate (silicon single crystal wafer) 11 after being subjected to the annealing process, it is possible to flatten the bulk region and the SOI region with no step difference. For example, it is possible to suppress the surface step difference (step difference (difference in height) in the surface of silicon single crystal wafer) between the bulk region and the SOI region to 10 nm or less.

Figure 4:
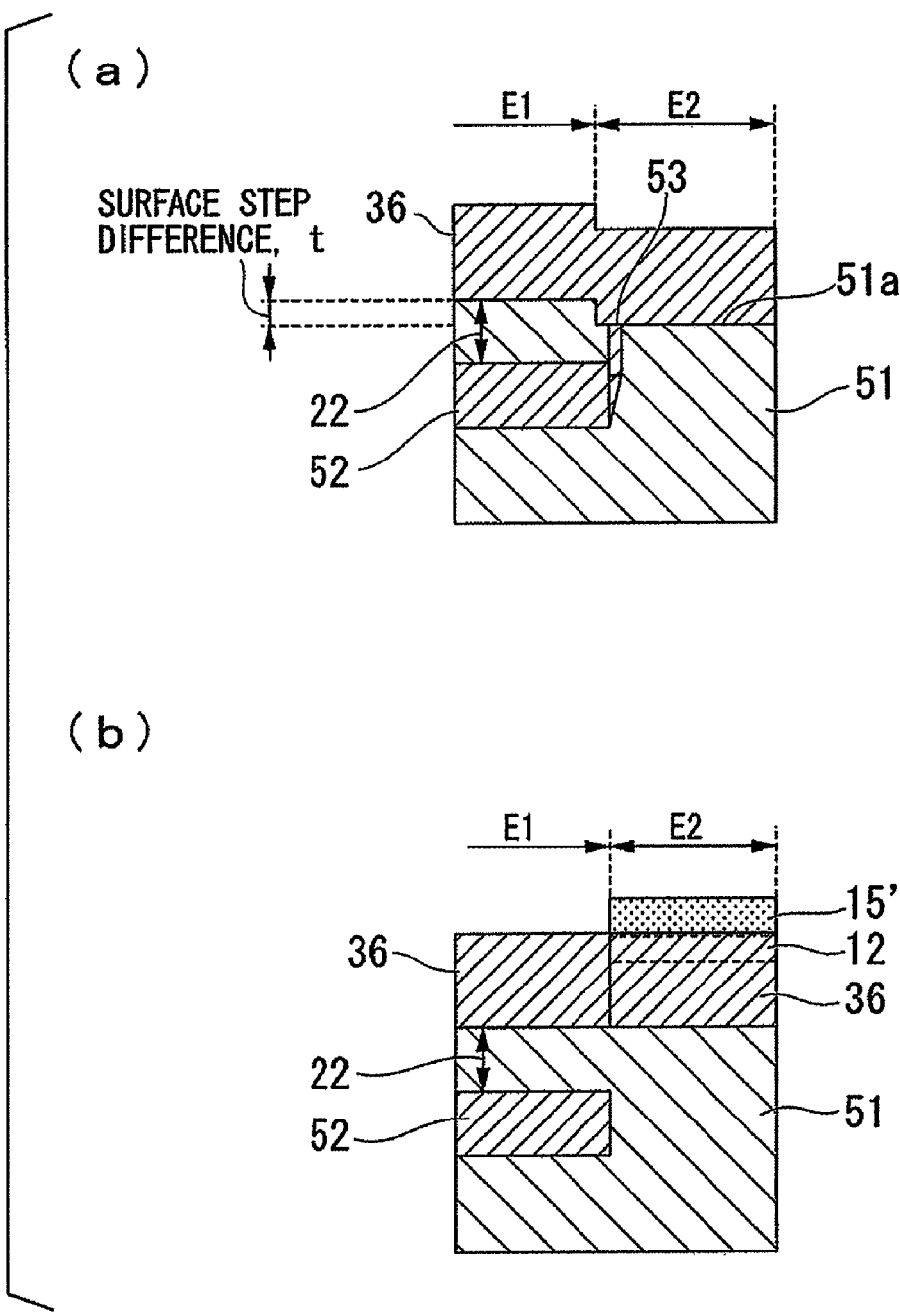
FIG. 4 shows explanatory diagrams illustrating a variation in the thickness of each part in an annealing process.

FIG. 4 shows explanatory diagrams schematically illustrating the surface state of the substrate (silicon single crystal wafer) through the annealing process in the region P shown by the dotted line in FIG. 3(c). FIG. 4(a) shows an example of the manufacturing method of the related art, and FIG. 4(b) shows an example of the manufacturing method of the present invention. In the example of the manufacturing method of the related art shown in FIG. 4(a), during a process of annealing a substrate (silicon single crystal wafer) 51, when an oxygen high-concentration layer is thermally oxidized and is converted into a BOX layer 52 composed of a silicon oxide, the volume thereof is expanded. Thereby, in the surface 51a of the substrate 51, a step difference indicated by t is generated between a region (SOI region) E1 where the BOX layer 52 is formed and a region (bulk region) E2 where the BOX layer 52 is not formed. Therefore, the surface 51a of the substrate 51 after the annealing process could not be maintained flat. Moreover, the end portion 53 of the BOX layer 52 was exposed to the surface of the substrate 51. Here, in FIG. 4, the reference numeral 36 indicates a coated oxide film, and the reference numeral 22 indicates an SOI layer.

On the other hand, in the example of the manufacturing method of the present invention shown in FIG. 4(*b*), in a bulk region E2, after the annealing process starts, at first, oxygen is consumed to oxidize the silicon film 15 formed in the mask layer 17. And then, after the silicon film 15 such as the polysilicon film or the like is oxidized to become an oxide film 15', the oxidation of the surface of the substrate 11 starts. On the other hand, in the SOI region E1, the oxidation of the surface of the substrate 11 starts just after the annealing process starts. Therefore, it is possible to suppress the oxidized amount of the substrate 11 in the bulk region E2 rather than that in the SOI region E1.

For this reason, by optimizing the film thickness of the silicon film 15 formed in the mask layer 17, it is possible to obtain a flat surface with no step difference between the SOI region E1 and the bulk region E2 in the surface 11*a* of the substrate 11. For example, it is possible to suppress the surface step difference between the bulk region E2 and the SOI region E1 to 10 nm or less. Moreover, it is possible to prevent the edge portion of the BOX layer from being exposed to the surface of the substrate 51.

After the annealing process as described above, a coated oxide film 36 covering the whole substrate 11 is removed by, for example, etching such as the wet etching (oxide film removal process). Thereby, it is possible to obtain an SIMOX wafer 40 in which the BOX layer 21 is partially formed in accordance with a circuit pattern to be formed (FIG. 3(*d*)). In the obtained SIMOX wafer 40, the surface 11*a* of the substrate 11 in the SOI region E1 and the bulk region E2 is maintained flat with no step difference. For example, it is possible to suppress the surface step difference of the substrate 11 between the SOI region E1 and the bulk region E2 to 10 nm or less.

Moreover, in FIG. 3(*c*), it is possible to uniformly etch the coated oxide film 36 by flattening the surface of the coated oxide film 36 which covers the whole substrate 11 with no step difference. For this reason, after the removal of the coated oxide film 36, the surface 11*a* of the substrate 11 in the SOI region E1 and the bulk region E2 can be maintained flat. Thereby, when a circuit is formed by photolithography in the post-process, it is possible to prevent the occurrence of troubles where an exposing light is not focused on a wafer surface.

Figure 5:
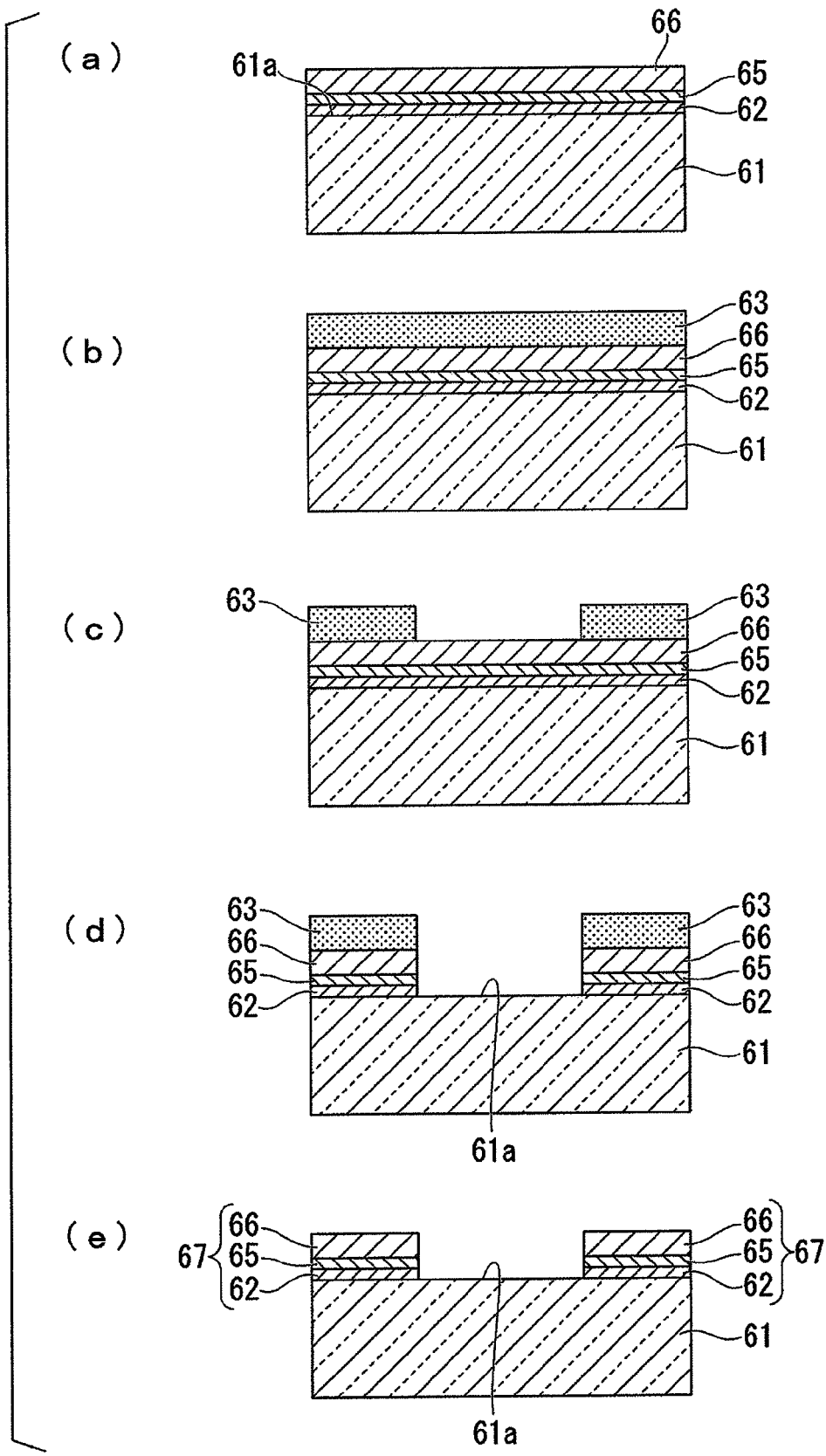
FIG. 5 shows cross-sectional views illustrating, in a step-wise manner, processes of another example of the method for manufacturing of the SIMOX wafer according to the present invention.

FIG. 5 shows cross-sectional views illustrating, in a stepwise manner, processes of another example of the method of manufacturing the mask layer in the method for manufacturing the SIMOX wafer according to the present invention. In the embodiment, a surface oxide film (first silicon oxide film) 62, a silicon film (either one or both of a polysilicon film and an amorphous silicon film) 65, and a mask oxide film (second silicon oxide film) 66 are formed to laminate in this order in one surface 61*a* of a substrate 61 (silicon single crystal wafer) (FIG. 5(*a*)).

Next, a resist layer 63 is formed (by applying a resist liquid) so as to overlap the mask oxide film 66 (FIG. 5(*b*)). Thereafter, this resist layer 63 is modified in a predetermined shape (FIG. 5(*c*)). Then, the surface oxide film 62, the silicon film 65, and the mask oxide film 66 are subjected to etching while using the resist layer 63 as a mask (see FIG. 5(*d*)). As for the method of etching, the dry etching such as, for example, the reactive ion etching may be performed. And then after the resist layer 63 is removed, a mask layer 67 is formed on one surface 61*a* of the substrate 61, and in the mask layer 67, the surface oxide film (first silicon oxide film) 62, the silicon film (either one or both of the polysilicon film and the amorphous silicon film) 65, and the mask oxide film (second silicon oxide film) 66 are laminated in this order (see FIG. 5(*e*)).

The mask layer 67 in this embodiment is particularly optimal in the case where there is a little concern that the surface oxide film 62 is etched from the lateral sides thereof when the mask oxide film 66 in the mask layer 67 is removed in the post-process. In addition, the mask layer 67 in this embodiment is also suitable in the case where an etched amount of the surface oxide film 62 is negligible compared to the size of the mask layer 67 even when the surface oxide film 62 is etched from the lateral sides thereof. For example, this may be a case where a ratio of the size of the mask layer 67 to the etched amount is 20 or more, and the etched amount is considered to be negligible, such as the case where the etched amount is 0.5 μm, and the size of the mask layer 67 is 10 μm or more. Compared to the aforementioned embodiment, the process of forming the silicon film which covers the lateral sides of the surface oxide film 62 is omitted. Therefore, the mask layer 67 including the silicon film 65 can be formed by easier and fewer processes.

Here, in the embodiment shown in FIG. 5, during the etching, a portion of the silicon film 65 and the mask oxide film 66 may be solely removed, and the whole surface oxide film 62 may be left on one surface 61*a* of the substrate 61. In this case, the surface oxide film 62 may be used as a protective film in the oxygen implantation process (FIG. 6(*a*)).

Figure 6:
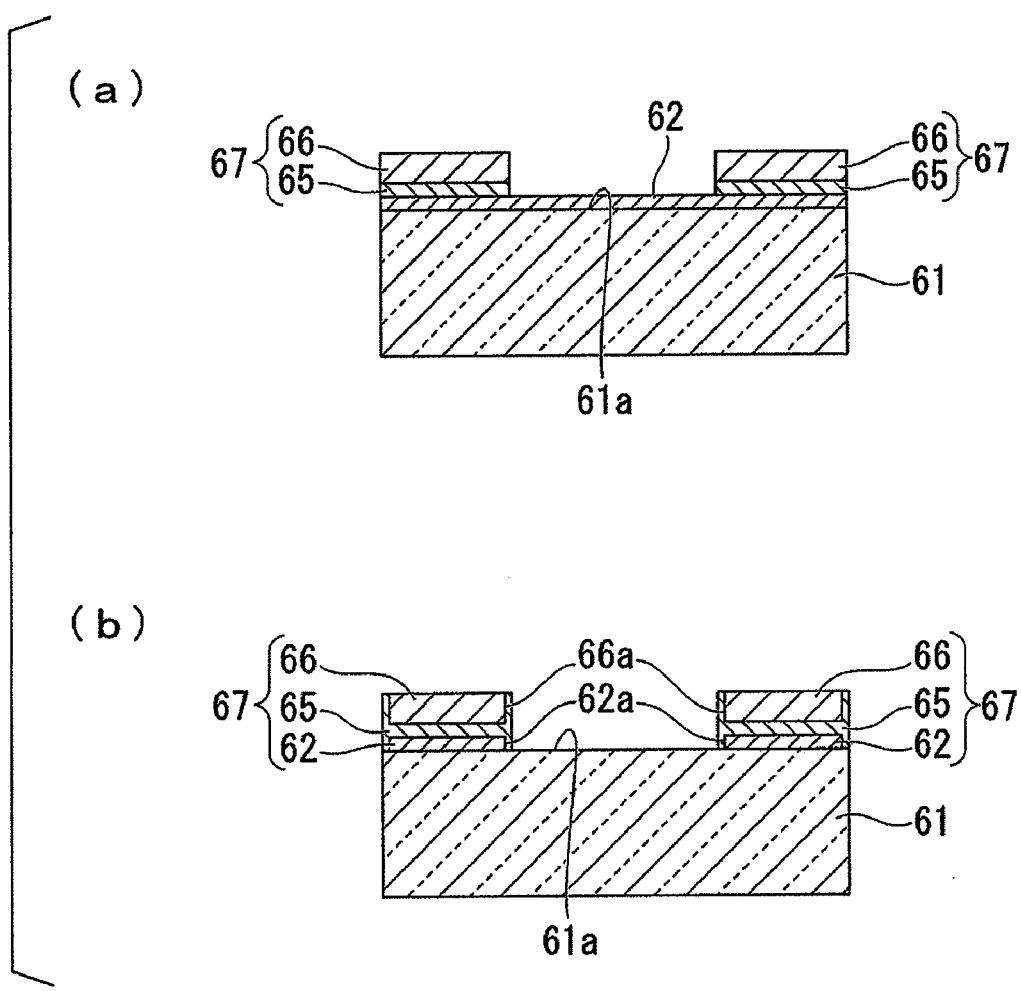
FIG. 6 shows cross-sectional views illustrating other embodiments in another example of the method for manufacturing of the SIMOX wafer according to the present invention.

Further, in the embodiment shown in FIG. 5, in the case where it is necessary to form a silicon film which covers the lateral sides of the surface oxide film 62, after the formation of the mask layer 67, the entirety thereof may be further covered by another thin silicon film 65, and then the thin silicon film 65 may be removed from one surface 61*a* of the substrate 61 only in a portion where the mask layer 67 is not formed (FIG. 6(*b*)). In the embodiment shown in FIG. 6(*b*), the silicon film 65 covers the lateral sides 66*a* of the mask oxide film 66 as well as the lateral sides 62*a* of the surface oxide film 62. However, the silicon film 65 may be formed such that the lateral sides 62*a* of the surface oxide film 62 is covered, while the lateral sides 66*a* of the mask oxide film 66 is not covered.

Further, in the present invention, given that the oxidation rate of the single crystal silicon and the oxidation rate of the polysilicon or the amorphous silicon are substantially identical with each other, the thickness of the polysilicon or the amorphous silicon to be formed in the mask layer may be set to be a value calculated by the formula of (the film thickness of the BOX layer to be formed)×0.55. For example, if the film thickness of the BOX layer to be formed is set to 200 nm, in accordance with the formation of the BOX layer, the surface in the SOI region becomes 110 nm (=200×0.55) higher than the surface in the bulk region. By forming either one or both of the polysilicon film and the amorphous silicon film having a height equivalent to this step difference (difference in height) in the bulk region, both regions are offset by an oxidation of silicon to cause a height of 110 nm, and finally the surface height becomes the same. Actually, the oxidation rate of the single crystal silicon and the oxidation rate of the polysilicon or the amorphous silicon are different from each other due to the film quality of the polysilicon film or the amorphous silicon film and the affect of a concentration of impurities. On the other hand, the surface of the SOI region is etched due to the affect of sputtering by the implantation of oxygen ions. For this reason, the film thickness of either one or both of the polysilicon and the amorphous silicon is needed to be optimized by experiments using the value calculated by the formula of (the film thickness of the BOX layer)×0.55 as a target.

In other words, the film thickness of either one or both of the polysilicon and the amorphous silicon is preferably set to be the value calculated by the formula of (the film thickness of the BOX layer)×0.55, and this film thickness is not dependent on the oxygen ion energy. With this, the whole film thickness of the mask layer with respect to the oxygen ion energy is preferably adjusted by controlling the film thickness of the oxide film formed on the polysilicon film or the amorphous silicon film. Table 1 shows the relationship between the ion energy and the film thickness of the mask layer.

TABLE 1 the Necessary Mask Film Thickness at Each of the Implantation Energy

|  | Energy [KeV] | Minimum required Mask film thickness [μm] | Preferred mask film thickness range [μm] |
|---|---|---|---|
| Example 1 | 200 | 0.6 | 0.8 to 1.2 |
| Example 2 | 100 | 0.3 | 0.5 to 0.8 |
| Example 3 | 50 | 0.15 | 0.2 to 0.5 |

EXAMPLES

As examples of the present invention, results of inspecting relationship between the implantation energy in the oxygen implantation process and the thickness range of the mask layer that is needed, and data on this occasion are shown in the following.

Here, the manufacturing processes of the examples of the present invention are shown in FIG. 7, and the manufacturing processes of the conventional examples are shown in FIG. 8. In the drawings, the same reference numerals are designated to the same components as those previously described. FIG. 7(*a*) and FIG. 8(*a*) correspond to the mask formation of FIGS. 1 and 2, and FIG. 7(*b*) and FIG. 8(*b*) correspond to the ion implantation (two times in different conditions) in FIG. 3(*a*). FIG. 7(*c*) and FIG. 8(*c*) correspond to the mask etching in FIG. 3(*b*). FIG. 7(*d*) and FIG. 8(*d*) correspond to the annealing shown in FIG. 3(*c*). FIG. 7(*e*) and FIG. 8(*e*) correspond to the oxide film etching shown in FIG. 3(*d*).

The mask layer 17 or the mask oxide film 16 shown in FIG. 7(*a*) or FIG. 8(*a*) was formed. Each film thickness of the films included in the obtained mask layer 17 or the mask oxide film 16 is shown in Table 2. Here, the sidewall thickness in Table 2 indicates the thickness of a portion of the silicon layer 15 disposed on the lateral side 12*a* of the surface oxide film 12.

Next, the oxygen ions were implanted under the conditions in Table 3. Here, in conventional example 1 and example 1, the implantation of oxygen ions was conducted two times under the common conditions of Implantation 1-1 and Implantation 1-2 shown in Table 3. In conventional example 2 and example 2, the implantation of oxygen ions was conducted two times under the common conditions of Implantation 2-1 and Implantation 2-2 shown in Table 3. In conventional example 3 and example 3, the implantation of oxygen ions was conducted two times under the common conditions of Implantation 3-1 and Implantation 3-2 shown in Table 3.

TABLE 2

|  | Conventional example 1 | Example 1 | Conventional example 2 | Example 2 | Conventional example 3 | Example 3 |
|---|---|---|---|---|---|---|
| Oxide film 12 | 0 nm | 20 nm | 0 nm | 20 nm | 0 nm | 20 nm |
| Polysilicon film 15 | 0 nm | 90 nm | 0 nm | 60 nm | 0 nm | 30 nm |
| Oxide film 16 | 900 nm | 790 nm | 600 nm | 520 nm | 300 nm | 250 nm |
| Mask film thickness (total) | 900 nm | 900 nm | 600 nm | 600 nm | 300 nm | 300 nm |
| Sidewall thickness (E3) | none | 50 nm | none | 30 nm | none | 20 nm |

TABLE 3

|  | Conventional example 1, Example 1 | | Conventional example 2, Example 2 | | Conventional example 3, Example 3 | |
|---|---|---|---|---|---|---|
|  | Implantation 1-1 | Implantation 1-2 | Implantation 2-1 | Implantation 2-2 | Implantation 3-1 | Implantation 3-2 |
| Implantation energy (KeV) | 200 | 185 | 100 | 90 | 50 | 45 |
| Dose amount (/cm$^2$) | $3 \times 10^{17}$ | $3 \times 10^{15}$ | $2 \times 10^{17}$ | $2 \times 10^{15}$ | $1.5 \times 10^{17}$ | $1.5 \times 10^{15}$ |
| Substrate temperature (° C.) | 400 | Room temperature | 400 | Room temperature | 400 | Room temperature |

Next, the mask oxide film 16 was etched (mask etching). Each film thickness after the mask etching was shown in Table 4. Here, in the conventional examples, the mask oxide film was entirely removed. In the examples, only the oxide film 16 was removed, and the surface oxide film 12 and the silicon film (polysilicon film) 15 were left.

Next, in the conventional examples and the examples, annealing was performed under the conditions shown in Table 5. Here, in conventional example 1 and example 1, the annealing was performed under the same conditions. In conventional example 2 and example 2, the annealing was performed under the same conditions, and in conventional example 3 and example 3, the annealing was performed under the same conditions.

After the annealing process, a coated oxide film 36 covering the whole substrate 11 was removed by the wet etching in the conventional examples and the examples.

Table 6 shows the wafer structure of the wafer after the annealing and the removal of a coated oxide film.

As seen from Table 6, in accordance with the method for manufacturing the SIMOX wafer of the present invention, it was possible to eliminate the silicon wafer surface step difference between the region where the BOX layer was formed and the region where the mask layer was formed; and thereby, the flatness could be maintained. At the same time, it was possible to prevent the edge portion of the BOX layer from being exposed to the surface of the wafer.

In accordance with the results shown in Tables 2 to 6, it has been known that the thickness of the mask layer that is needed is almost proportional to the implantation energy, and the higher the implantation energy becomes, the thicker the mask layer is required to be formed.

While preferred embodiments of the present invention have been described and illustrated above, it should be understood that these are examples of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method for manufacturing a SIMOX wafer where a BOX layer composed of silicon oxide is locally formed in an interior of a silicon single crystal wafer, the method comprising:
    forming a mask layer on one surface side of a silicon single crystal wafer, which has an opening on a region where a BOX layer is to be formed;
    implanting oxygen ions through the opening of the mask layer into the silicon single crystal wafer to a predetermined depth, and locally forming an oxygen implantation region;
    annealing the silicon single crystal wafer with the mask layer, and oxidizing the oxygen implantation region so as to form the BOX layer; and
    removing a coated oxide film that covers the whole silicon single crystal wafer which is formed in the annealing of the silicon single crystal wafer,
    wherein the mask layer is composed of a first silicon oxide film, either one or both of a polysilicon film and an amorphous silicon film, and a second silicon oxide film,

TABLE 4

| (Mask film thickness after etching) (nm) | Conventional example 1 | Example 1 | Conventional example 2 | Example 2 | Conventional example 3 | Example 3 |
|---|---|---|---|---|---|---|
| Oxide film 12 | 0 nm | 20 nm | 0 nm | 20 nm | 0 nm | 20 nm |
| Polysilicon film 15 | 0 nm | 90 nm | 0 nm | 60 nm | 0 nm | 30 nm |
| Oxide film 16 | 0 nm | 0 nm | 0 nm | 0 nm | 0 nm | 0 nm |
| Mask film thickness (total) | 0 nm | 110 nm | 0 nm | 80 nm | 0 nm | 50 nm |

TABLE 5

|  | Conventional example 1, Example 1 | Conventional example 2, Example 2 | Conventional example 3, Example 3 |
|---|---|---|---|
| Annealing condition | 1,350° C., 15 hours, and atmosphere; Ar + 70% O$_2$ | 1,350° C., 8 hours, and atmosphere; Ar + 40% O$_2$ | 1,350° C., 4 hours, and atmosphere; Ar + 20% O$_2$ |

TABLE 6

|  | Conventional example 1 | Example 1 | Conventional example 2 | Example 2 | Conventional example 3 | Example 3 |
|---|---|---|---|---|---|---|
| Coated oxide film 36 (E1 region) | 680 nm | 680 nm | 320 nm | 320 nm | 150 nm | 150 nm |
| Coated oxide film 36 (E2 region) | 680 nm | 710 nm | 320 nm | 340 nm | 150 nm | 160 nm |
| film thickness of SOI layer (E1 region) | 90 nm | 90 nm | 50 nm | 50 nm | 30 nm | 30 nm |
| film thickness of BOX layer 21 (E1 region) | 150 nm | 150 nm | 90 nm | 90 nm | 50 nm | 50 nm |
| Surface step difference, t (difference between E1 surface and E2 surface) | 80 nm | <5 nm | 50 nm | <5 nm | 25 nm | <5 nm |
| Exposure of the end portion of the BOX layer to the surface of the substrate | Exposed | Not exposed | Exposed | Not exposed | Exposed | Not exposed | which are laminated in this order from the one surface side of the silicon single crystal wafer, and wherein the method further comprises removing the second silicon oxide film from the mask layer between the implanting of the oxygen ions and the annealing of the silicon single crystal wafer.

2. The method for manufacturing the SIMOX wafer according to claim 1, wherein the oxide film of the mask layer is composed of silicon oxide.

3. The method for manufacturing the SIMOX wafer according to claim 1, wherein the removing of the second silicon oxide film is conducted by a wet etching method.

4. The method for manufacturing the SIMOX wafer according to claim 1, wherein end portions of either one or both of the polysilicon film and the amorphous silicon film extend towards the silicon single crystal wafer so as to cover sides along a thickness direction of the oxide film positioned beneath either one or both of the polysilicon film and the amorphous silicon film.

5. The method for manufacturing the SIMOX wafer according to claim 1, wherein a silicon wafer surface step difference between a region where the BOX layer is formed and a region where the mask layer is formed after the removing of the coated oxide film is 10 nm or less.

6. A SIMOX wafer which is manufactured by the method for manufacturing the SIMOX wafer according to claim 1.

* * * * *